United States Patent
Fan et al.

(10) Patent No.: US 9,293,378 B2
(45) Date of Patent: Mar. 22, 2016

(54) HIGH EFFICIENCY FINFET DIODE

(71) Applicant: TAIWAN SEMICONDUCTOR MANUFACTURING COMPANY, LTD., Hsin-Chu (TW)

(72) Inventors: Hsueh-Shih Fan, Hsinchu (TW);
Sun-Jay Chang, Hsinchu (TW);
Chia-Hsin Hu, Changhua (TW);
Min-Chang Liang, Zhu-Dong Town (TW); Shien-Yang Wu, Jhudong Town (TW); Wen-Hsing Hsieh, Hsinchu (TW); Ching-Fang Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/792,024

(22) Filed: Jul. 6, 2015

(65) Prior Publication Data

US 2016/0005660 A1 Jan. 7, 2016

Related U.S. Application Data

(62) Division of application No. 13/951,202, filed on Jul. 25, 2013, now Pat. No. 9,093,566.

(60) Provisional application No. 61/747,764, filed on Dec. 31, 2012.

(51) Int. Cl.
*H01L 21/8238* (2006.01)
*H01L 21/265* (2006.01)
*H01L 21/02* (2006.01)

(52) U.S. Cl.
CPC .... *H01L 21/823821* (2013.01); *H01L 21/0257* (2013.01); *H01L 21/26513* (2013.01); *H01L 21/823871* (2013.01); *H01L 21/823878* (2013.01)

(58) Field of Classification Search
CPC ............ H01L 29/861; H01L 29/66795; H01L 29/6609; H01L 21/845; H01L 27/0814; H01L 29/66136; H01L 21/823821; H01L 27/1021; H01L 21/26513; H01L 21/0257; H01L 21/823871; H01L 21/823878

USPC .................................. 438/328, 237, 359, 218
See application file for complete search history.

(56) References Cited

U.S. PATENT DOCUMENTS

| 2011/0095372 A1* | 4/2011 | Yuan ................. H01L 21/76229 257/368 |
|---|---|---|
| 2014/0131831 A1 | 5/2014 | Wei et al. |
| 2014/0183641 A1 | 7/2014 | Fan et at. |

FOREIGN PATENT DOCUMENTS

| CN | 1016098 | 12/2009 |
| TW | 201121051 | 6/2011 |
| TW | 201133704 | 10/2011 |
| TW | 201133792 | 10/2011 |
| TW | 1203383 | 1/2012 |

OTHER PUBLICATIONS

Taiwan Patent Office, Taiwanese Office Action dated Jun. 15, 2015 for Application No, 102145802, 4 pgs.

* cited by examiner

*Primary Examiner* — Thien F Tran
(74) *Attorney, Agent, or Firm* — Haynes and Boone, LLP

(57) ABSTRACT

Disclosed are methods to form a FinFET diode of high efficiency, designed to resolve the degradation problem with a conventional FinFET diode arising from reduced active area, and a method of fabrication. The FinFET diode has a doped substrate, two spaced-apart groups of substantially parallel, equally-spaced, elongated semiconductor fin structures, dielectric layers formed between the two groups and among the fin structures for insulation, a plurality of substantially equal-spaced and parallel elongated gate structures perpendicularly traversing both groups of the fin structures, and two groups of semiconductor strips respectively formed lengthwise upon the two groups of the fin structures. The two groups of semiconductor strips are doped to have opposite conductivity types, p-type and n-type. The FinFET diode further has metal contacts formed upon the semiconductor strips. In an embodiment, the semiconductor strips may be integrally formed with the fin structures by epitaxial growth and in-situ doped.

20 Claims, 6 Drawing Sheets

| Total Fin No. in a unit cell | Unit Cell Effective OD Area | Total Cell Area (A) | Injection Current | Efficiency= Injection Current/A |
|---|---|---|---|---|
| 12 | 100% | 58.3% | 70.8% | 121.4% |
| 8 | 100% | 62.5% | 83.8% | 134.1% |
| 6 | 100% | 66.7% | 90.2% | 135.2% |
| 4 | 100% | 75.0% | 95.8% | 127.7% |
| 2 | 100% | 100.0% | 100.0% | 100.0% |

HIGH EFFICIENCY FINFET DIODE

This application is a divisional application of U.S. patent application Ser. No. 13/951,202, now U.S. Pat. No. 9,093,566, filed on Jul. 25, 2013, which claims priority to U.S. Provisional Patent Application Ser. No. 61/747,764, filed on Dec. 31, 2012. The entireties of both disclosures are hereby incorporated herein by reference.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) devices. The use of FinFET devices has been gaining popularity in the semiconductor industry. FinFET devices offer several advantages over traditional Metal-Oxide Semiconductor Field Effect Transistor (MOSFET) devices (also referred to as planar devices). These advantages may include better chip area efficiency, improved carrier mobility and fabrication processing that is compatible with the fabrication processing of planar devices. Thus, it may be desirable to design an integrated circuit (IC) chip using FinFET devices for a portion of, or the entire IC chip.

A typical FinFET device is fabricated with a thin fin-like structure called a "fin", extending from a substrate, and a gate provided over (e.g., wrapping around) the fin. The fin structure is made of semiconductor material, typically silicon, and if used as a transistor, has a current channel formed inside. When the FinFET device is used as a transistor, the gate is used to control the current in the channel.

A diode can be built on a FinFET structure using silicon-on-insulator (SOI) technology in a fashion generally identical to those built in today's planar SOI technologies or bulk CMOS technologies. Compared to the traditional planar semiconductor diodes, however, the diodes constructed by using the FinFET structure have a shortcoming of reduced efficiency due to the degradation caused by the fin structures. The presence of plural fin structures in the FinFET diodes reduces the active area for producing injection current, and thereby decreases efficiency of the diodes, defined by injection current generated per a unit cell area.

Therefore, there is a need to provide a FinFET diode and a method to manufacture the same that has a higher efficiency than the conventional FinFET diodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
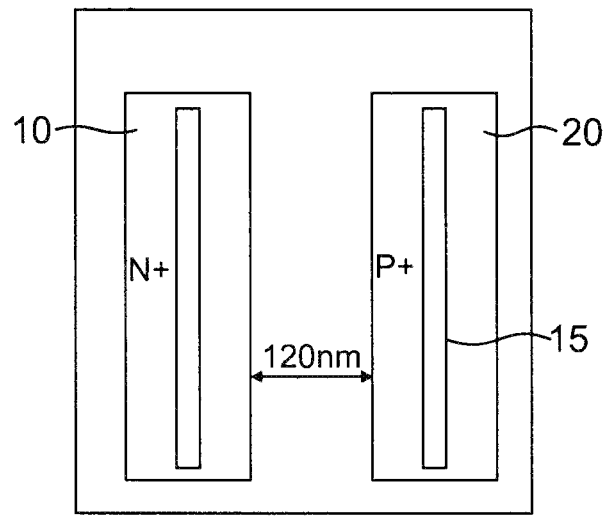
FIGS. 1A and 1B are schematic top plan views of a traditional planar diode and a typical FinFET diode designed in the prior art, respectively.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

The various aspects of the present disclosure, illustrated in FIGS. 2-5, involve a process for fabricating a FinFET diode of high efficiency and a FinFET diode so made. It should be understood that the invention is applicable to various semiconductor technologies, for example, silicon on insulator (SOI), complementary metal oxide semiconductor (CMOS), BiCMOS, bipolar, and silicon germanium (SiGe), as long as the FinFET diode is electrically isolated from other such fins and the substrate.

Figure 1B:
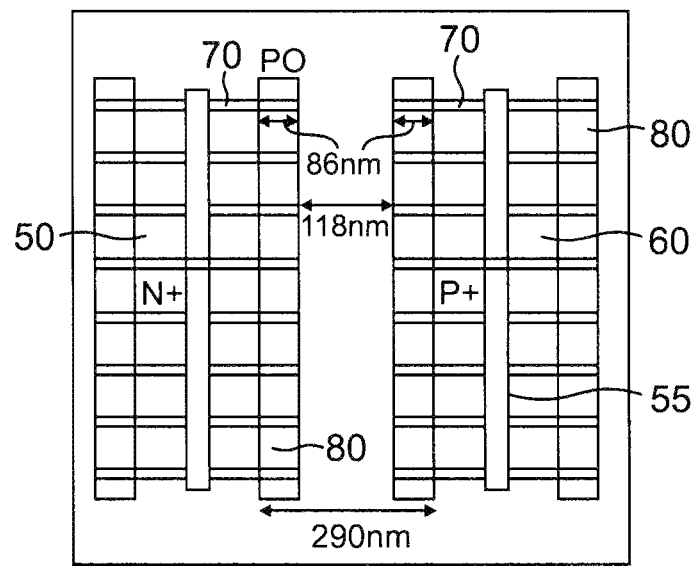

Now referring to the figures, FIGS. 1A and 1B provide schematic top plan views of a first planar diode and a first FinFET diode, respectively. Just as a planar diode has two different implant regions 10 and 20 in FIG. 1A, doped by p-type and n-type dopants (impurities) to form a p-n junction therebetween, the FinFET diode shown in FIG. 1B, also has two oppositely doped regions 50 and 60 formed upon the fin structures 70 and between the gate structures 80. The black bars 15 and 55 schematically denote metal contacts to the doped regions for providing bias between the two regions. For a FinFET diode, the gate structures are not electrically active as in a transistor where they played active role of controlling currents in the channels formed within the fin structures.

It is known that due to the presence of plural fin structures in the FinFET diodes, the active area for producing injection current becomes reduced, thereby decreasing the efficiency of the diodes, which is defined by injection current generated per a unit cell area. For example, in the particular FinFET structure in FIG. 1B, which has a fin width of 10 nanometer ("nm"), a gate spacing of 118 nm, a gate pitch 204 nm, and fin pitch 48 nm, it can be calculated that the efficiency reduces to about 20% as compared to a planar diode in FIG. 1A for the same drawn area.

Figure 2:
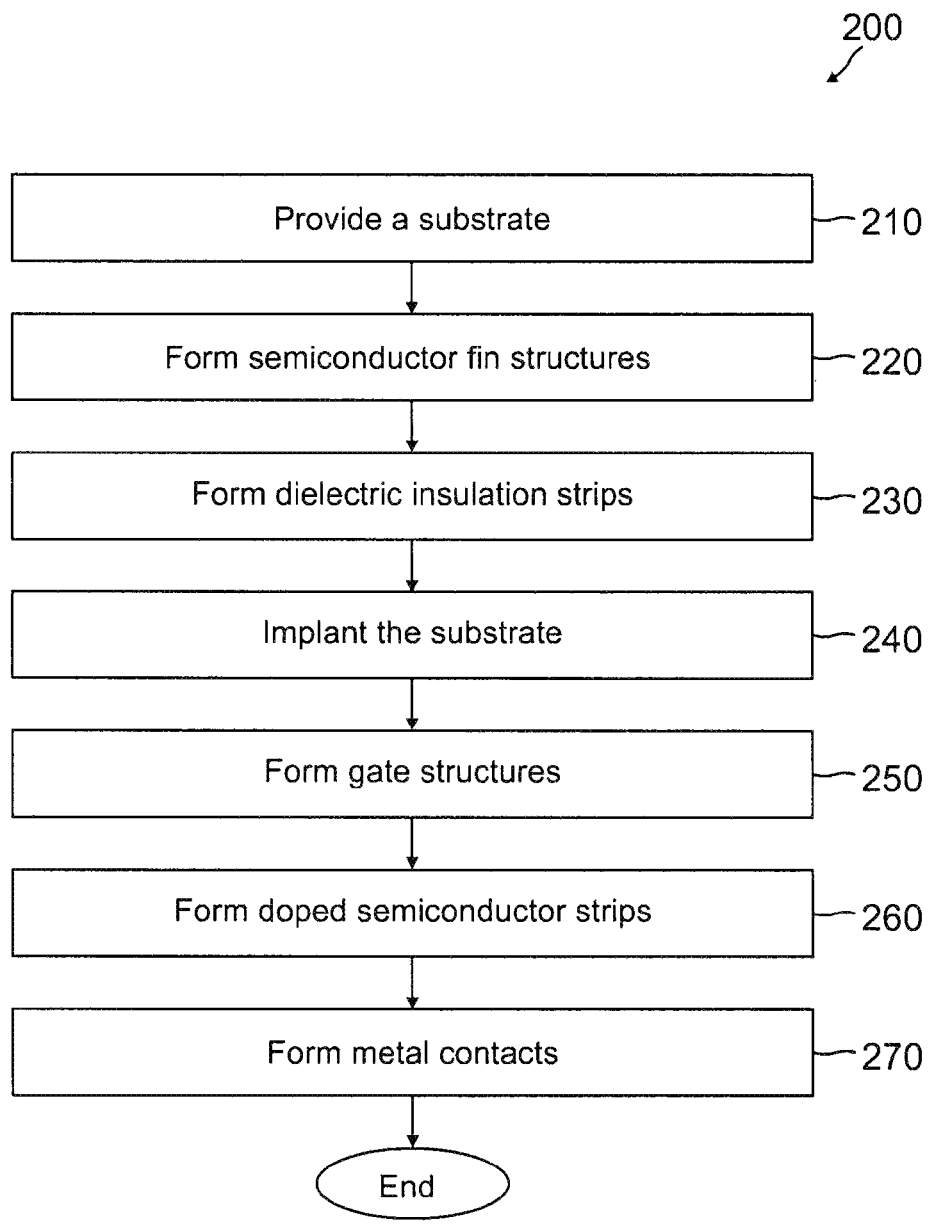
FIG. 2 is a flowchart of a process for fabricating a FinFET diode of high efficiency in accordance with aspects of the present disclosure.

FIG. 2 is a flowchart of a process 200 for fabricating a FinFET diode of high efficiency in accordance with aspects of the present disclosure. FIGS. 3A-3I are schematic diagrams illustrating the process 200 of FIG. 2 in accordance with aspects of the present disclosure.

Figure 3A:
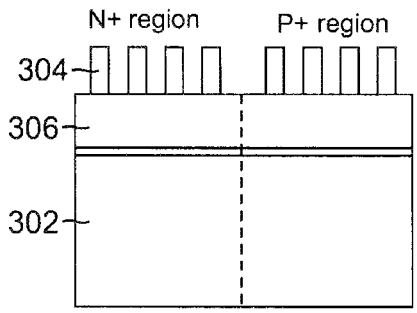
FIGS. 3A-3I are schematic diagrams of a process for forming a FinFET diode of high efficiency in accordance with aspects of the present disclosure.

At step 210, a substrate is provided. FIG. 3A shows a schematic cross-sectional view of a layer of stack comprising a substrate 302, a hard mask layer 306, and a photoresist 304 formed or provided according to an aspect of the present disclosure.

In the present embodiment, the substrate 302 includes a single semiconducting material such as bulk silicon. Alternatively, the substrate 302 may comprise other suitable elementary semiconducting materials, such as germanium in crystal; a compound semiconductor, such as silicon carbide, silicon germanium, gallium arsenic, gallium phosphide, indium phosphide, indium arsenide, and/or indium antimonide; or combinations thereof. The substrate 302 may also include an insulator layer on top of the semiconductor layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as separation by implantation of oxygen (SIMOX), oxidation, deposition, and/or other suitable process. Alternatively, the substrate 302 may further include another semiconductor layer on top of an insulator layer to form a silicon-on-insulator (SOI) substrate, which can be fabricated using wafer bonding, and/or other suitable methods. The substrate 302 may comprise any suitable crystallographic orientation (e.g., a (100), (110), (111), or (001) crystallographic orientation).

Figure 3B:
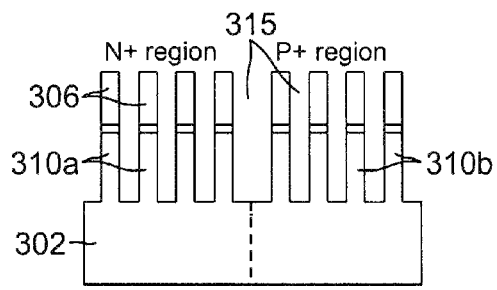

At step 220, one or more substantially parallel elongated semiconductor fin structures 310 are formed upon the substrate 302. The formation of the fin structures 310 is achieved by using a layer of photoresist 304 and a hard mask layer 306 disposed upon the substrate 302 and suitable processes including deposition, photolithography, and/or etching processes as depicted in FIGS. 3A and 3B.

The photoresist 304 may be any suitable material used in the art, such as Poly (methyl methacrylate) (PMMA), Poly (methyl glutarimide) (PMGI), Phenol formaldehyde resin (DNQ/Novolac), SU-8, and may be either positive or negative photoresist. These materials are all applied as a liquid and, generally, spin-coated to ensure uniformity of thickness. After prebaking, the photoresist layer 304 is exposed to an ultraviolet (UV), deep ultraviolet (DUV) or electron beam through a pattern via a photomask. The exposure to light causes a chemical change that allows some of the photoresist to be removed by a special solution, called "developer" by analogy with photographic developer. For positive photoresist, the most common type, the exposed part becomes soluble in the developer. After going through a post-exposure baking process, the remaining (unexposed) parts of the photoresist 304 form a mask that resists etching. FIG. 3A shows such photoresist masks 304 that resulted from the exposure, developing, and post-exposure baking process. In the embodiment shown in FIG. 3A, the photoresist masks 304 are patterned to conform to substantially parallel, equal-spaced, and elongated fin structures 310 to be produced in the subsequent step. In an embodiment of the present disclosure, the fin structures 310 to be formed on the substrate 302 may be divided into two groups of multiple, equal numbered fin structures, one for forming an implant region of a type thereon, thereon, and the other for forming an n-typed doping region thereon. And preferably, the two groups of the fin structures may be separated from each other such that their separation may be greater than the average spacing among the fin structures within each group. Accordingly, as shown in FIG. 3A, the photoresist masks 304 may be patterned into two groups, corresponding to two doping regions of opposite implantation types, with a gap between the two groups that is greater than the inter-spacing of the masks 304. The photoresist masks 304 may then be used to etch the fin structure 310 into the silicon layer.

The hard mask layer 306 is needed to form dielectric strips between the fin structures 310 for insulation in a later step, and may be formed upon the substrate 302 and below the photoresist masks 304 by any suitable process. It may be composed of silicon nitride ($Si_3Ni_4$) or any suitable material, such as SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

After forming the photoresist masks 304 and a hard mask layer 306 as shown in FIG. 3A, the fin structures 310 are formed out of the substrate 302 by etching the hard mask layer 306 and the substrate 302 using reactive ion etching (RIE) processes and/or other suitable processes. As shown in FIG. 3B, portions of the hard mask layer 306 and the substrate 302 that lie under the photoresist masks 304 survive the etching as shown in FIG. 3B. The surviving portions of silicon substrate 302 form the silicon fin structures 310, the surviving portions of the hard mask layer 306 become spacers for the layer of dielectric insulation to be filled among the fin structures 310, and the etched-out portions define the trenches 315.

In another example, silicon fin structures 310 may be formed by patterning and etching a silicon layer deposited overlying an insulator layer (for example, an upper silicon layer of a silicon-insulator-silicon stack of an SOI substrate). Alternatively, the fin structures 310 may be formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes.

When etching the hard mask layer 306 and the substrate 302, any known etching processes may be used, such as wet etching, dry etching, or plasma etching, but when an anisotropic etching is desired, a plasma etching may be used. In one embodiment, etching the polymer may use a mixture of process gases. For instance, oxygen and tetrafluoromethane (CF4), when mixed together for use in plasma etching, create the oxyfluoride ion (OF−). The oxyfluoride ion is a powerful etching agent for polymeric substances. This ion is particularly adept at cutting the carbon-carbon molecular bonds in the polymer backbone and removing the molecule quickly. The etchants that may be used for polymer etching may include, but are not limited to, wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$.

After etching portions of the hard mask layer 306 and the silicon substrate 302, then the photoresist masks 304, which are no longer needed, are removed by a process called an ashing. This process usually requires a liquid "resist stripper", which chemically alters the resist so that it no longer adheres to the hard mask layer 306. Alternatively, the photoresist masks 304 may be removed by a plasma containing oxygen, which oxidizes it. FIG. 3B shows the remaining portions of the hard mask layer 306 after the etching and ashing processes, which act as spacers 306 for forming a layer of dielectric insulation among the fin structures 310 in the next step.

Also, FIG. 3B shows the fin structures 310 created being divided into two groups of multiple but equal numbered fin structures, 310a and 310b, respectively formed adjacent two opposing ends of the substrate 302 and spaced apart from each other by a distance greater than the average spacing among the fin structures within each group, one for forming an implant region of a p-type thereon, and the other for forming an n-typed doping region thereon in a subsequent step.

Figure 3C:
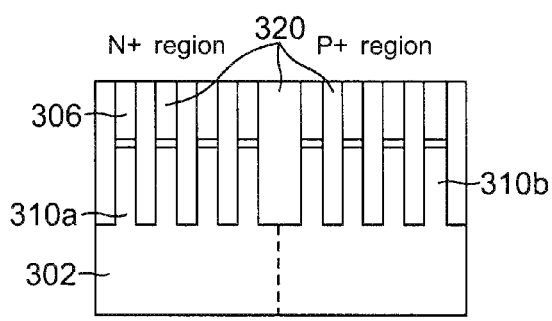

Next, at step 230, a plurality of dielectric strips 320 are formed within the trenches 315 defined among the fin structures 310 for insulation, i.e., to electrically isolate the fin structures 310 from one another, by utilizing isolation technology, such as local oxidation of silicon (LOCOS) or shallow trench isolation (STI). For that, a dielectric material is deposited by spin-on coating or spin-on dielectric (SOD) process, CVD, or any other suitable deposition processes upon the fin structures 310, the hard mask spacers 306, and the trenches 315 to form a dielectric layer. After the deposition, the upper portions of deposited dielectric layer may be removed by, in an embodiment, a Chemical Mechanical Polishing/Planarization ("CMP") process down to the level of the top surfaces of the hard mask spacers 306, as shown in FIG. 3C, completing the formation of the dielectric strips 320 that are interwovenly disposed among the fin structures 310 in each group, 310a and 310b, and in the region between the two groups. The dielectric material used for the strips 320 may be the typical undoped and doped silicon dioxide (SiO2), silicon oxynitride (SiON), silicon nitride (Si3N4), high-density plasma (HDP) oxides, TEOS oxides, high-k dielectric material such as a hafnium oxide (HfO$_2$), HiSiO, HfSiON, HfTaO, HfTiO, HfZrO, zirconium oxide, aluminum oxide, hafnium dioxide-alumina (HfO$_2$—Al$_2$O$_3$) alloy, titanium nitride (TiN), or any other suitable materials, or combinations thereof. In some embodiments, the dielectric strips 320 may have a multi-layer structure such as a thermal oxide liner layer filled with silicon nitride or silicon oxide.

Figure 3D:
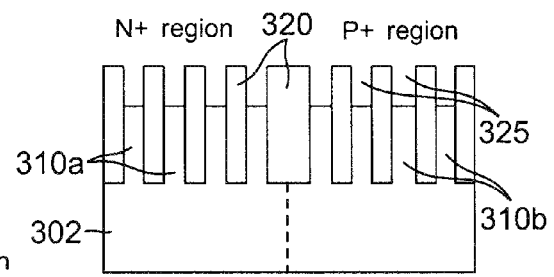

After formation of the plurality of dielectric strips 320, the spacers 306 may be removed by an etching process, defining trenches 325 between dielectric strips 320 and upon the fin structures 310 as shown in FIG. 3D. Any known etching processes may be used, such as wet etching or dry etching. When an anisotropic etching is desired, a plasma etching may be used. The etchants may be any one that is known in the art such as Cl$_2$, CCl$_4$, SiCl$_2$, BCl$_3$, CCl$_2$F$_2$, CF$_4$, SF$_6$, or NF$_3$.

Figure 3E:
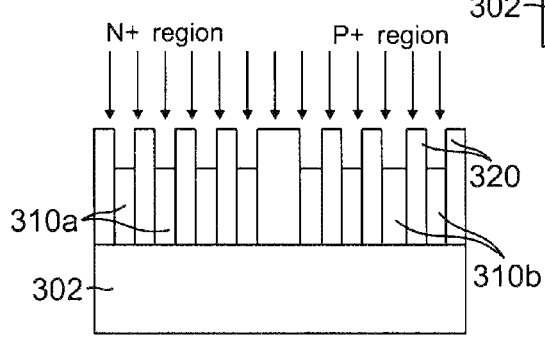

Next, at step 240, the substrate 302 is doped by a suitable implantation process as depicted in FIG. 3E. Here, the substrate 302 may be doped with any dopant known in the art, including p-type (P+) dopants or impurities, such as boron or BF2, to form a p-type well, or n-type (N+) dopants or impurities, such as phosphorus or arsenic and/or combinations thereof, to form an n-type well. Depending upon the type of dopants, the well has two opposite conductivity types, i.e., electric conduction either by electrons or holes, and the finished FinFET diode may become either P-type or N-type. During the implantation process, the density and penetration depth of dopants may be controlled such that although the dopants are implanted through the fin structures 310 into the substrate 302, only the substrate 302 becomes primarily doped.

Figure 3F:
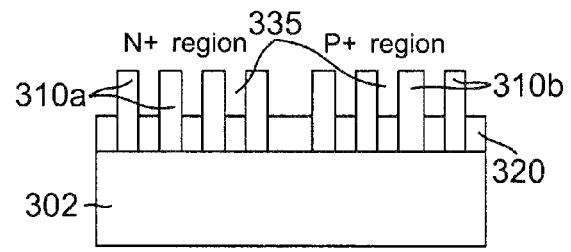

After finishing implantation of the substrate 302, the dielectric strips 320 may be partially removed by a suitable etching process, defining fin recesses 335 between the fin structures 310 as shown in FIG. 3F. Any known etching processes may be used, such as wet etching or dry etching. When an anisotropic etching is desired, a plasma etching may be used. The etchants may be any one that is known in the art such as Cl$_2$, CCl$_4$, SiCl$_2$, BCl$_3$, CCl$_2$F$_2$, CF$_4$, SF$_6$, or NF$_3$.

Figure 3G:
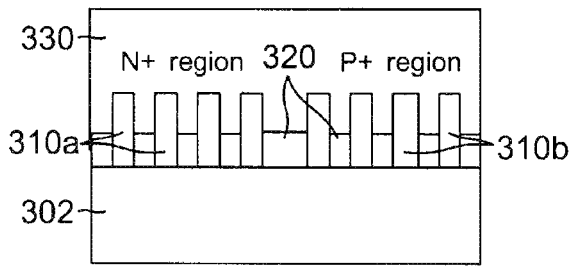

Next, at step 250, one or more elongated gate structures 330 are formed over the fin structures 310 as depicted in FIG. 3G. The gate structures 330 are substantially equal-spaced and parallel to one another, and extended perpendicular to the fin structures 310. In the present disclosure for a FinFET diode, the gate structures 330 are inactive as contrasted to the FinFET transistors, but used to divide the elongated doped semiconductor strips 340 to be subsequently formed upon the two groups of the fin structures, 310a and 310b, into different sections for enhancing the stability of the structure. The material used for the gate structures 330 may be the typical polysilicon or any other commonly used metals such as Ni, Ti, Ta, Hf, and combinations thereof, metal silicides such as NiSi, MoSi, HfSi, combinations thereof, and metal nitrides such as TiN, TaN, HfN, HfAlN, MoN, NiAlN, and combinations thereof.

The gate structures 330 may be formed by any suitable process known in the art, including deposition, photolithography patterning, and etching processes. The deposition of a suitable gate material to form a gate electrode layer may include chemical vapor deposition (CVD), physical vapor deposition (PVD), atomic layer deposition (ALD), molecular beam epitaxy (MBE), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process may be implemented or replaced by other proper methods such as maskless photolithography, electron-beam writing, and ion-beam writing. The etching processes may include dry etching, wet etching, and/or other etching methods (e.g., reactive ion etching). After formation of a gate layer by deposition, any surplus of the gate layer in its upper part may be removed by a process of CMP.

In one embodiment, a gate dielectric layer may be further formed between the gate structures 330 and the fin structures 310 by suitable processes. The dielectric material may include commonly used materials such as oxides, nitrides, oxynitrides, high-K dielectrics such as Ta$_2$O$_5$, Al$_2$O$_3$, HfO, SiTiO$_3$, HfSiO, HfSiON, or combinations thereof. In another embodiment, gate spacers (not shown) may be further formed on the sidewalls of the gate dielectric layer and gate structures.

Figure 3H:
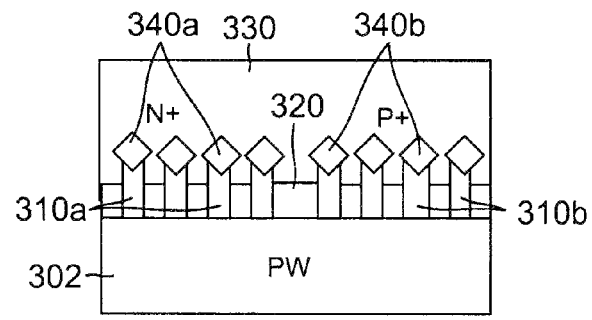
Figure 3I:
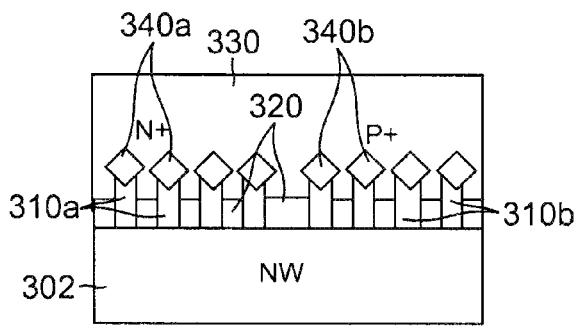

Finally at step 260, a plurality of doped semiconductor strips 340 are formed, as source and drain (S/D) regions, upon the fin structures 310 as shown in FIGS. 3H and 3I. The doped semiconductor strips 340 comprises two groups, p-doped strips 340a and n-doped strips 340b, which are respectively formed upon the two groups of the fin structures, 310a and 310b. Each of them has a similar elongated configuration as the fin structures 310, extends lengthwise in parallel over the fin structures 310, being bordered by the previously formed gate structures 330.

In one embodiment, the strips 340 may be formed via a selective epitaxial growth process. The epitaxy process may include chemical vapor deposition (CVD) including vapor-phase epitaxy (VPE) and/or ultra-high vacuum CVD (UHV-CVD), physical vapor deposition (PVD), molecular beam epitaxy (MBE), high density plasma CVD (HDPCVD), metal organic CVD (MOCVD), remote plasma CVD (RPCVD), Electro-less deposition, plating, or any suitable processes known in the art and/or combinations thereof. Such an epitaxial process may use either gaseous and/or liquid precursors. The semiconducting material composing the strips 340 may be, in one embodiment, the same material as the fin structures 310 that are of the same material as the substrate 302 in the particular embodiment of the process depicted in FIGS. 3A-3I. In another embodiment, the semiconducting material of the strips 340 may be different from that of the substrate 302. For example, if the resulting FinFET diode is a P-type, the material of the strips 340 may include silicon Germanium (SiGe), and if the resulting FinFET diode is a n-type, the material of the strips 340 may include silicon carbon (SiC).

During their formation by an epitaxial growth, the two groups of strips, 340a and 340b, may be in-situ doped by any suitable implantation processes known in the art. They are doped respectively with p-type impurities, such as boron or BF2, and with n-type impurities, such as phosphorus or arsenic to form doped p-type and n-type regions. As is known in the art, masks such as photo resists may be formed to cover regions not to be implanted. The impurity concentration may be between about $10^{13}/cm^3$ and about $10^{19}/cm^3$, or even greater than $10^{20}/cm^3$ to produce heavily doped regions. After the implantation process, one or more annealing processes may be performed to activate the S/D regions. The annealing processes comprise rapid thermal annealing (RTA) and/or laser annealing processes. In the resulting structure after implantation, a P-N junction is formed between either the P+ region or N+ region, comprising respectively the two groups of strips, 340a and 340b, and the fin structures thereunder, depending on the type of the doped well. For example, if the well is doped with p-type impurities (P-well), the P-N junction is formed between N+ doped group of semiconductors strips and the fin structures thereunder.

After formation of the doped strips 340 at step 260, a dielectric material may be further deposited thereon by the spin-on coating or spin-on dielectric (SOD) process, CVD, or any other suitable deposition processes to electrically isolate the two groups of doped strips 340a and 340b from each other, and further, each of the strips from one another. The dielectric material may be the typical silicon dioxide (SiO2), silicon oxynitride (SiON), silicon nitride (Si3N4), high-density plasma (HDP) oxides, TEOS oxides, high-k dielectric material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN), or any other suitable materials, or combinations thereof.

In the embodiment shown in FIGS. 3A-3I, the doped semiconductor strips 340 are formed by an epitaxial growth after the fin structures 310 have been formed by etching processes. In another embodiment (not shown), however, the fin structures themselves may be formed by an epitaxial growth upon a planar substrate, rather than being formed out of the substrate by an etching process. In that embodiment, the doped semiconductor strips may be formed simultaneously with the fin structures as an integral part of them by the epitaxial growth, while being in-situ doped.

Lastly at step 270, one or more metal contacts are formed upon the two groups of doped strips 340a and 340b for providing a forward bias between the S/D regions. The contacts may be formed by a salicide (self-aligned silicide) process, which involves deposition of a transition metal to form a thin layer via a suitable process such as CVD, application of heat to allow the transition metal to react with exposed silicon in the active regions (source and drain) to form a low-resistance transition metal silicide, and removal of any remaining transition metal by chemical etching, leaving silicide contacts only in the active regions. The typical transition metal may include nickel, cobalt, tungsten, tantalum, titanium, platinum, erbium, palladium, or combinations thereof.

Figure 4:
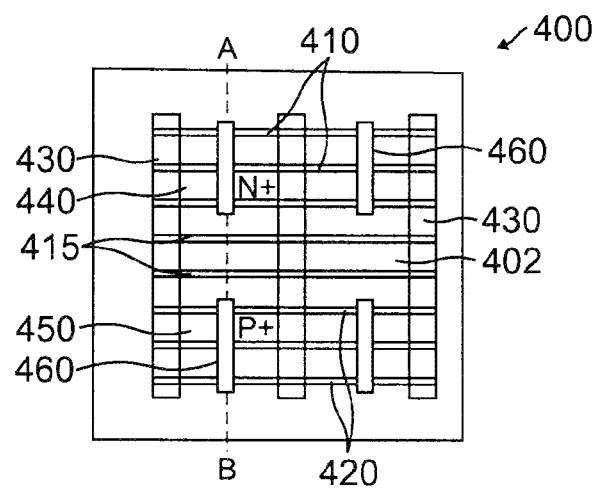
FIG. 4 is a schematic top plan view of a FinFET diode of high efficiency made in an aspect of the present disclosure.

FIG. 4 is a schematic top plan view of a FinFET diode 400 made in an aspect of the present disclosure. The FinFET diode 400 largely comprises a substrate 402 having two opposing ends, two groups of substantially parallel elongated semiconductor fin structures 410 and 420, three per each group, respectively formed adjacent the two opposing ends upon the substrate 402, substantially equal-spaced and parallel elongated gate structures 430 formed upon the fin structures 410 and 420, each of which traverses both group fin structures 410 and 420 perpendicularly, two oppositely doped (p-doped and n-doped) areas or groups of semiconductor strips, 440 and 450, respectively formed upon the fin structures 410 and 420, and metal contacts 460 formed upon and adjoined with the two doped areas or groups of strips, 440 and 450. The doped areas or groups of strips, 440 and 450, are divided into different sections by the perpendicularly traversing gate structures 430, and in each section, there exists one pair of electrically disconnected metal contacts 460, each of which is in contact with and adjoining all doped strips in the same respective groups, 440 and 450.

The two oppositely doped areas 440 and 450 are separated from each other by a separation greater than the mean interspacing among the fin structures 410 and 420 and insulated by a dielectric material filling the separation. In the embodiment shown in FIG. 4, the fin structures were formed first all equal spaced, and the doped semiconductor regions have been subsequently formed thereupon. In this case, there may be a few fin structures 415 present in the separation, which carries no doped material. FIG. 4 also shows the two doped areas or strips 440 and 450 being divided into several periodic sections by the gate structures 430. Such sectioning of the doped strips may be desirable to ensure the structural stability of during and after the formation of the doped semiconductor strips 440 and 450 in accordance of the process described in FIGS. 3A-3I.

Figure 5:
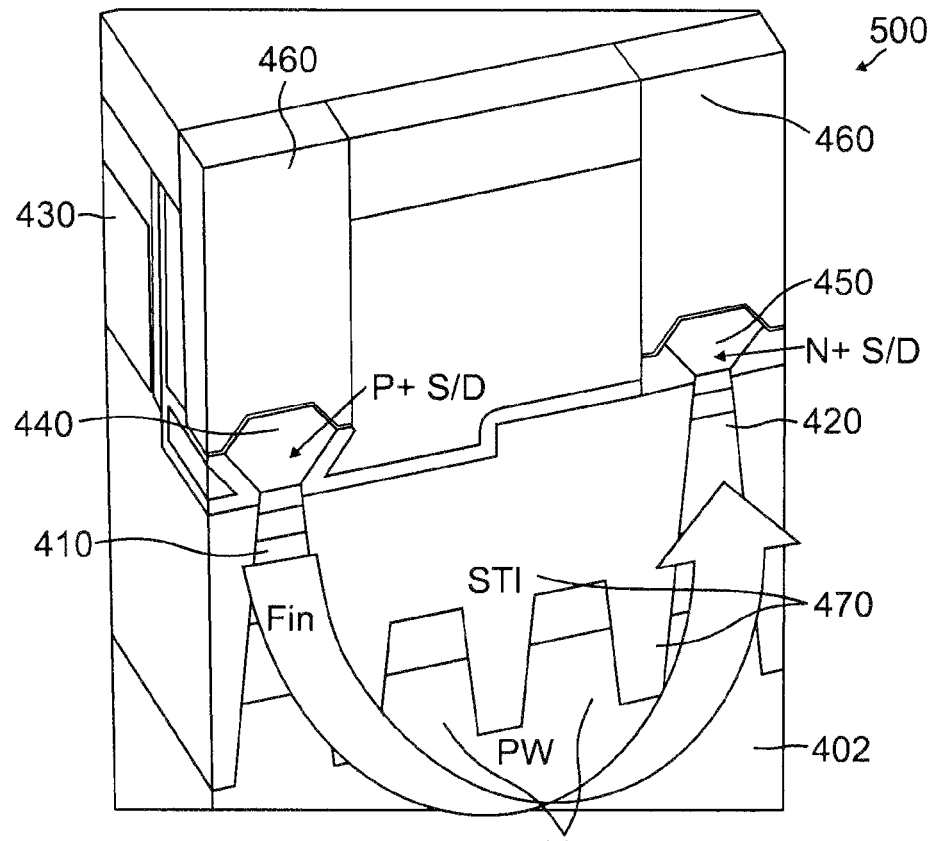
FIG. 5 is a perspective cross-sectional view of a FinFET diode of high efficiency made in an aspect of the present disclosure.

FIG. 5 is a perspective cross-sectional view of a FinFET diode 500 made in an embodiment of the present disclosure. The view is obtained by cutting the FinFET diode 400 in FIG. 4 along the plane A-B. The difference is that in the FinFET diode 500, there is shown only one fin structure for each of the two oppositely doped regions, while in the FinFET diode 400 there are shown three. The FinFET diode 500 has two elongated parallel fin structures 410 and 420, formed upon a substrate 402 doped with p-type dopants to form a P-well, (which may be doped with n-type dopants to form N-well), two elongated oppositely doped semiconductor strips 440 and 450, respectively formed upon the two fin structures 410 and 420, STI of dielectric material 470 separating and insulating the fin structures 410 and 420 from each other, as well as the doped semiconductor strips 440 and 450 from each other, two metal contacts 460 formed upon, and adjoined with, the two doped semiconductor strips 440 and 450, respectively, and an elongated gate structure 430 formed upon, but extending perpendicularly across the fin structures 410 and 420. The traversing gate structure 430 would mark ends of the two doped semiconductor strips 440 and 450. In the separation between the two fin structures 410 and 420, there may be a few pre-formed, un-doped fin structures 415 having a shortened height by an etching process.

In the particular embodiment shown in FIG. 5, the substrate 402 is doped to form a P-well, and the P-N junction would be formed between the N+ doped semiconductor strip 450 and the fin structure 420 thereunder, and the injection current would flow the P+ doped region (semiconductor strip 440) to the N+ doped semiconductor strip 450 through the well as indicated by the arrow in FIG. 5.

In the prior art FinFET diode, schematically shown in FIG. 1B, the entire section of fin structures, defined as the region between two neighboring gate structures, is doped with a same type of impurities to form either a p-type or n-type section, and in this structure, the P-N junction is formed between two such sections that are set apart and oppositely doped. By contrast, in the high efficiency FinFET diode in the present disclosure, schematically shown in FIGS. 4 and 5, each section of fin structures between two neighboring gate structures is divided into two separated and oppositely doped regions, P+ and N+ regions. In this structure, the P-N junction is formed between them within each section. Also, as contrasted to the prior art FinFET diode in FIG. 1B, in which the metal contacts runs through the entire fin structures in one section, the metal contacts 460 in the high efficiency FinFET diode of the present disclosure are disconnected in the middle of each section to run only within the two respective doped regions.

Figures 6A, 6B:
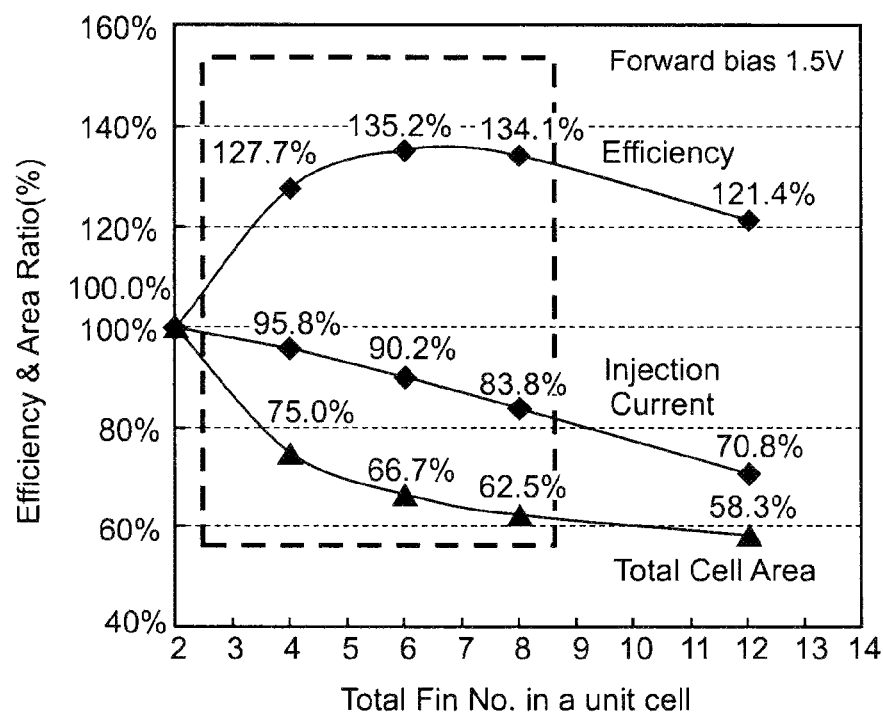
FIGS. 6A and 6B are computer simulation results for efficiency of various embodiments of a FinFET diode made in an aspect of the present disclosure.

The FinFET diode made according to the present disclosure, described in FIGS. 2-5, is found to overcome the reduced active area problem present in the prior art FinFET diode, and produce higher efficiency. FIGS. 6A and 6B show computer simulation results for the efficiencies of various embodiments of the FinFET diodes in the present disclosure. The simulations were performed by calculating the injection currents produced by FinFET diodes having 2, 4, 6, 8, and 12 fin structures in a unit cell, defined by a section bordered by two neighboring gate structures in FIG. 4 and including two oppositely doped regions. In the simulation, the FinFET diodes to be compared were set to have a same total number of fin structures to ensure that all have the same effective area of active region. Accordingly, each diode is subject to have different total cell area, comprising different number of unit cells. The efficiency of a diode in this simulation has been defined to be injection current produced, divided by the total cell area. In all diodes, the ratio of the width of STI region, shown in FIG. 3, to the width of a fin structure was set to between 10~16 and the forward bias was set to be 1.5 V. As shown in the table of simulation results, FIG. 6A, and its plot in FIG. 6B, the FinFET diode made according to an aspect of the present disclosure has been found to be optimized, i.e., have the best efficiency, when the number of fin structures in each unit cell is 4, 6, and 8.

The FinFET diode manufactured according to a method in the present disclosure provides advantages over the FinFET diodes used in the prior art. It produces higher efficiency by mitigating the degradation problem in the conventional FinFET diodes due to the reduced active area for the presence of fin structures. Further, the method in the present disclosure provides a way of optimizing the FinFET diodes as varying the number of fin structures in a unit cell or other parameters such as bias, or STI width to fin width ratio. The FinFET diodes manufactured in the present disclosure may be used for an ESD (electrostatic discharge) diode in ESD protection circuits, or in any other types of application known in the art.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    providing a substrate having opposing first and second ends;
    forming a first and a second groups of one or more substantially equal-spaced, parallel, elongated, and equal numbered semiconductor fin structures upon the substrate adjacent the first and the second ends, respectively, the first and second groups being spaced apart from each other;
    forming a plurality of dielectric strips to be disposed among the first and the second groups of fin structures for electric insulation from one another;
    implanting the substrate with a dopant of either a first conductivity type or a second conductivity type opposite the first conductivity type;
    forming one or more substantially equal-spaced and parallel elongated gate structures formed upon the first and the second groups of fin structures such that each gate structure traverses both the first and the second groups of fin structures perpendicularly;
    forming a first group of one or more doped semiconductor strips having the first conductivity type lengthwise upon the first group of fin structures, respectively; and
    forming a second group of one or more second doped semiconductor strips having the second conductivity type lengthwise upon the second group of fin structures, respectively.

2. The method of claim 1, wherein each of the first and the second group of semiconductor strips is sectioned by the gate structures.

3. The method of claim 1, further comprising forming one or more metal contacts upon the first and the second group of semiconductor strips, respectively.

4. The method of claim 3, wherein all semiconductor strips in the first and the second groups are electrically connected from one another within the respective groups via the metal contacts.

5. The method of claim 1, wherein forming the first and the second groups of semiconductor strips comprises forming the same integrally with the respective first and second groups of fin structures by epitaxial growth.

6. The method of claim 5, wherein forming the first and the second groups of semiconductor strips further comprises in-situ doping the first and the second groups of semiconductor strips during the epitaxial growth.

7. The method of claim 1, wherein the number of the fin structures in a unit cell is 4, 6, or 8.

8. A method of forming a device, comprising:
    providing a semiconductor substrate doped to have either a first conductivity type or a second conductivity type opposite the first conductivity type;
    forming a first group and a second group of substantially equal-spaced, parallel, elongated, and equal numbered semiconductor fin structures formed over the substrate, the first and second groups being spaced-apart;
    forming a plurality of substantially equal-spaced and parallel elongated gate structures formed upon the first and the second groups of fin structures such that each gate structure traverses both the first and the second groups of fin structures perpendicularly;
    doping a top portion of each of the first group fin structures to have the first conductivity type; and doping a top portion of each of the second group fin structures to have the second conductivity type.

9. The method of claim 8, wherein the top portions of the first and the second groups of fin structures are sectioned by the gate structures.

10. The method of claim 8, further comprising forming one or more metal contacts upon the doped top portions of the first and the second groups of fin structures.

11. The method of claim 8, wherein the spacing between two closest fin structures, each of which is respectively from the first and second groups, is greater than the average spacing between two adjacent fin structures within the respective first and second groups.

12. The method of claim 8, wherein the number of the fin structures in a unit cell is one of 4, 6, and 8.

13. A method of forming a device, comprising:
 providing a semiconductor substrate doped to have a first conductivity type;
 forming a first plurality of substantially parallel, elongated fin structures over the substrate, each fin structure in the first plurality of fin structures having a semiconductor strip of the first conductivity type extending lengthwise thereon;
 forming a second plurality of substantially parallel, elongated fin structures over the substrate, the second plurality of fin structures being spaced from the first plurality of fin structures, and each fin structure in the second plurality of fin structures having a semiconductor strip of a second conductivity type extending lengthwise thereon, wherein the second conductivity type is opposite of the first conductivity type;
 forming a first elongated gate structure upon and perpendicularly traversing both the first and second plurality of fin structures; and
 forming a second elongated gate structure formed upon and perpendicularly traversing both the first and second plurality of fin structures, the second elongated gate structure being spaced from the first elongated gate structure.

14. The method of claim 13, wherein the semiconductor strips of the first and the second pluralities of fin structures are sectioned by the first and second gate structures.

15. The method of claim 13, further comprising forming one or more metal contacts upon the semiconductor strips of the first and second pluralities of fin structures.

16. The method of claim 13, wherein the spacing between two closest fin structures, each of which is respectively from the first and second pluralities of fin structures, is greater than the average spacing between two adjacent fin structures within the respective first and second pluralities of tin structures.

17. The method of claim 13, wherein the number of the fin structures in the first plurality of fin structures is one of 4, 6, and 8.

18. The method of claim 13, wherein the semiconductor strips are integrally formed with the respective fin structures of the first and second pluralities of fin structures by epitaxial growth.

19. The method of claim 18, wherein the semiconductor strips of the first and the second pluralities of fin structures are in-situ doped during the epitaxial growth.

20. The method of claim 13, wherein the fin structures in the first plurality of fin structures are electrically isolated from one another.

* * * * *